(12) United States Patent
Wu et al.

(10) Patent No.: US 6,518,126 B2
(45) Date of Patent: Feb. 11, 2003

(54) METHOD OF FORMING AND OPERATING TRENCH SPLIT GATE NON-VOLATILE FLASH MEMORY CELL STRUCTURE

(75) Inventors: Meng-Yi Wu, Kaohsiung Hsien (TW); Kung-Hong Lee, Pingtung Hsien (TW); Fu-Yuan Chen, Kaohsiung Hsien (TW); Hsin-Fen Chou, Changhua Hsien (TW); Ching-Song Yang, Chang-Hua Hsien (TW); Ya-Chin King, Chungli (TW); Ching-Hsiang Hsu, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/063,435

(22) Filed: Apr. 23, 2002

(65) Prior Publication Data
US 2002/0175394 A1 Nov. 28, 2002

(30) Foreign Application Priority Data
Apr. 24, 2001 (TW) ......................................... 90109732 A

(51) Int. Cl.$^7$ ........................................... H01L 21/8247
(52) U.S. Cl. ....................................... 438/259; 438/267
(58) Field of Search .......................... 38/258, 259, 266, 38/267, 270, 589

(56) References Cited

U.S. PATENT DOCUMENTS

| | | | | | |
|---|---|---|---|---|---|
| 5,399,516 A | * | 3/1995 | Bergendahl et al. | ........ | 438/259 |
| 5,495,441 A | * | 2/1996 | Hong | .......................... | 438/259 |
| 6,316,315 B1 | * | 11/2001 | Hofmann et al. | ........... | 438/259 |

* cited by examiner

Primary Examiner—Chandra Chaudhari
(74) Attorney, Agent, or Firm—Winston Hsu

(57) ABSTRACT

A method of forming and operating a trench split-gate non-volatile flash memory cell structure. The auxiliary gate of the structure is formed inside a trench on one side of the gate and the source terminal is underneath the auxiliary gate, thereby reducing overall area occupation of the auxiliary gate and the source terminal relative to the cell and increasing packing density. By enclosing the common source terminal inside a deep N-well layer, source resistance for reading data from the cell is reduced and the process of etching out a contact opening is simplified. The structure also ensures the injection of most hot electrons into the floating gate, thereby increasing execution speed.

5 Claims, 9 Drawing Sheets

METHOD OF FORMING AND OPERATING TRENCH SPLIT GATE NON-VOLATILE FLASH MEMORY CELL STRUCTURE

CROSS REFERENCE TO RELATED APPLICATIONS

This application claims the priority benefit of Taiwan application serial No. 90109732, filed Apr. 24, 2001.

BACKGROUND OF INVENTION

1. Field of Invention

The present invention relates to a method of forming and operating a non-volatile flash memory cell structure. More particularly, the present invention relates to a method of forming and operating a trench split gate non-volatile flash memory cell structure.

2. Description of Related Art

In recent years, the need for non-volatile memory has increased at a rapid rate due to the exponential growth of portable electronic product markets. As technologies for manufacturing flash memories improve, unit cost is greatly reduced stimulating a wider application. Digital cameras, electronic organizers, MP3, electronic answering machines and programmable integrated circuits (IC) often depend on flash memory for data storage.

Most flash memory is designed as a type of electrically programmable read-only-memory (EPROM) having an N-channel memory unit. Programming is conducted using channel hot electrons. Among various types of flash memory units, split gate structure has the best hot electron programming efficiency. A conventional stacked flash memory using a channel hot electron injection mechanism or a flash memory using a channel initiated secondary electron injection mechanism through the application of a negative bias voltage on substrate has a hot electron injection efficiency (gate current over drain current) for programming, around $10^{-6} \sim 10^{-8}$. However, a split gate flash memory using a source side injection (SSI) hot electron programming mechanism can reach an efficiency of $10^{-4} \sim 10^{-6}$.

FIG. 1 is a schematic cross-sectional view of a conventional split-gate flash memory unit. This type of split-gate flash memory is also referred to as a sidewall select-gate on the source side (SISOS). To program the split-fate flash memory, a voltage $V_{CG}=17V$ is applied to the control gate 10, a voltage $V_D=5V$ is applied to the drain terminal 12 and a voltage Vs=Vsub=0V is applied to the source terminal 14 and the substrate 16. In addition, a voltage $V_{SWG}=2V$ is applied to the select gate terminal 18 so that a 5V voltage differential is formed between the source terminal 14 and the neighborhood of node A. Hence, electron injection is boosted and electrons are channeled into interior of the floating gate 20 through the voltage $V_{CG}=17V$ applied to the control gate terminal 10. The select gate terminal 18 is capable of controlling the electric field created between the source terminal 14 and the node A so that electron injection efficiency is effectively raised. To conduct an erasure, a voltage $V_D=14V$ is applied to the drain terminal 12 while other contact points remain at 0V. Therefore, electrons within the floating gate 20 drain away via the drain terminal 12.

Although the aforementioned split-gate flash memory structure has a relatively high efficiency, each memory unit needs to occupy a larger surface area due to the incorporation of a select gate over the source terminal. Thus, each split-gate memory unit occupies more area than a conventional flash memory unit leading to a lowering of packing density and memory capacity. Furthermore, the injection of electrons into the floating gate after crossing over the select gate relies on the hot electrons created by the high electric field at the gap due to a high voltage between the select gate and the floating gate. Rather than focusing at the floating gate, the accelerated electrons focus upon the underlying depletion layer created by the floating gate and the drain voltage. Hence, unless a very high voltage at the gate terminal and a matching drain voltage are applied so that the accelerated electrons converge upon the floating gate region, only a minority of electrons will ultimately end up inside the floating gate.

SUMMARY OF INVENTION

Accordingly, one object of the present invention is to provide a method of forming and operating a trench split-gate non-volatile flash memory structure. Area occupation of the select gate and the source terminal inside a trench split-gate non-volatile flash memory cell relative to the entire cell is reduced and hence packing density of the memory is increased. Furthermore, the trench split-gate non-volatile flash memory cell structure is also specially fabricated to inject most accelerated electrons into the floating gate and hence operating efficiency of the memory is increased.

To achieve these and other advantages and in accordance with the purpose of the invention, as embodied and broadly described herein, the invention provides a trench split-gate non-volatile flash memory cell structure. The structure comprises a P-type substrate, a deep N-well layer, a shallow P-well layer, a source region, a trench auxiliary gate region, a gate region and a drain region. The P-type substrate, the deep N-well layer and the shallow P-well layer are arranged into a stack with P-type substrate at the bottom, the deep N-well layer in the middle and the shallow P-well layer on top. The source region is embedded inside the deep N-well layer. The trench auxiliary gate region is embedded within the deep N-well layer and the shallow P-well layer above the source region. The gate region is above the shallow P-well layer on one side of the auxiliary gate region. The drain region is embedded within the P-well layer on one side of the gate region. In addition, a metal silicide layer covers the exposed drain region and the trench auxiliary gate region.

The trench auxiliary gate includes a polysilicon layer and an oxide layer at the bottom and each side of the polysilicon layer. The gate includes a first polysilicon layer, a second polysilicon layer above the first polysilicon layer and an isolation layer between the first and the second polysilicon layer and on the sidewalls of the first polysilicon layer. The isolation layer can be an oxide-nitride-oxide (ONO) layer, an oxide-nitride (ON) layer or a nitride (N) layer.

This invention also provides a method of forming trench split-gate non-volatile flash memory cells that include the following steps. First, a P-type substrate is provided. A deep N-well layer is formed in the P-type substrate and a shallow P-well layer is formed over the deep N-well layer. A gate region is formed over the P-well layer and a drain region and an auxiliary gate region are formed on each side of the gate region. A spacer is formed on each side of the gate region. A trench is formed in the deep N-well layer and the shallow P-well layer within the auxiliary gate region. An oxide layer is formed inside the trench. The deep N-well layer and the drain region of the P-well layer underneath the trench are heavily doped to form a source terminal and a drain terminal. A first polysilicon layer is deposited over the gate region to form a floating gate. An isolation layer is formed over the first polysilicon layer, the drain region and the trench. A second polysilicon layer is formed over the isolation layer to form a control gate. Furthermore, a metal silicide layer may form over the exposed drain terminal and the trench auxiliary gate after the formation of the trench auxiliary gate. Hence, resistance between the auxiliary gate and the drain terminal is lowered, thereby increasing reading current and lowering RC delay.

This invention also provides a method of operating a trench split-gate non-volatile flash memory cell. A word line voltage, a source voltage, an auxiliary gate voltage and a bit line voltage are applied to the gate region, the source region, the trench auxiliary gate and the drain region respectively. The bottom section of the flash memory cell structure includes, from top to bottom, a shallow P-well layer, a deep N-well layer and a P-type substrate. The source region is embedded within the deep N-well layer and the trench auxiliary gate region is above the source region embedded within the shallow P-well layer and the deep N-well layer. The operation method includes the following steps.

To conduct a programming operation, a high voltage is applied to the word line. A voltage lower than the word line voltage is applied to the bit line. A voltage lower than both the word line voltage as well as the bit line voltage is applied to the source terminal. A voltage lower than both the word line voltage and the bit line voltage is applied to the auxiliary gate terminal.

To conduct an erasing operation, a low voltage is applied to the word line. A voltage higher than the word line voltage is applied to the bit line. A voltage higher than the word line voltage but lower than the bit line voltage is applied to the source terminal. A voltage higher than the word line voltage but lower than the bit line voltage is applied to the auxiliary gate terminal.

To conduct a reading operation, a higher voltage is applied to the word line and a voltage lower than the word line voltage is applied to the source terminal. A voltage higher than the source terminal voltage is applied to the bit line. Similarly, a voltage higher than the source terminal is also applied to the auxiliary gate terminal.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
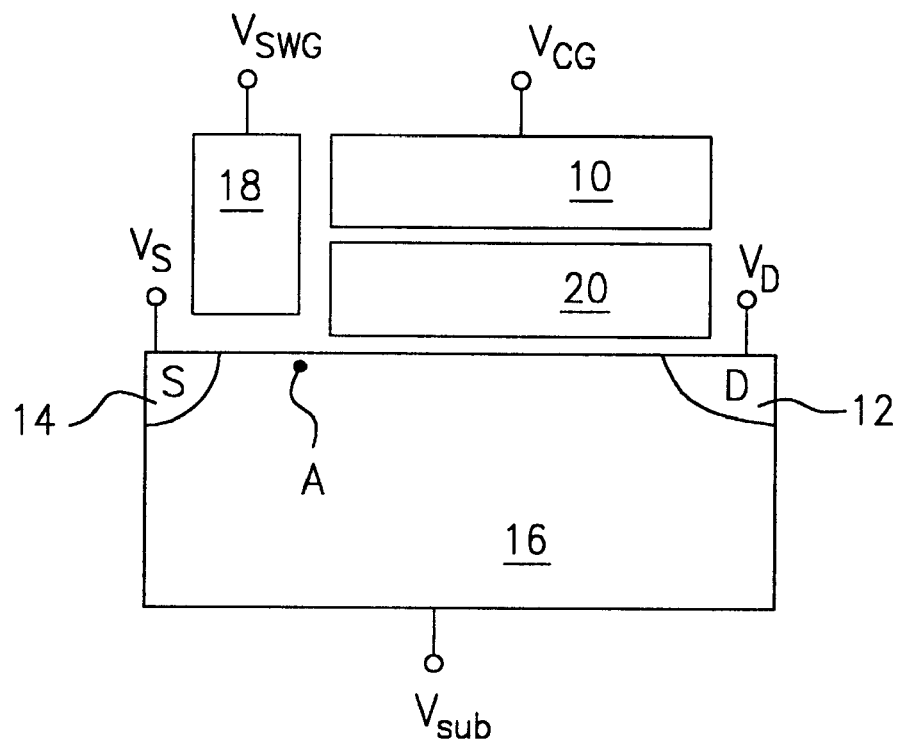
FIG. 1 is a schematic cross-sectional view of a conventional split-gate flash memory unit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
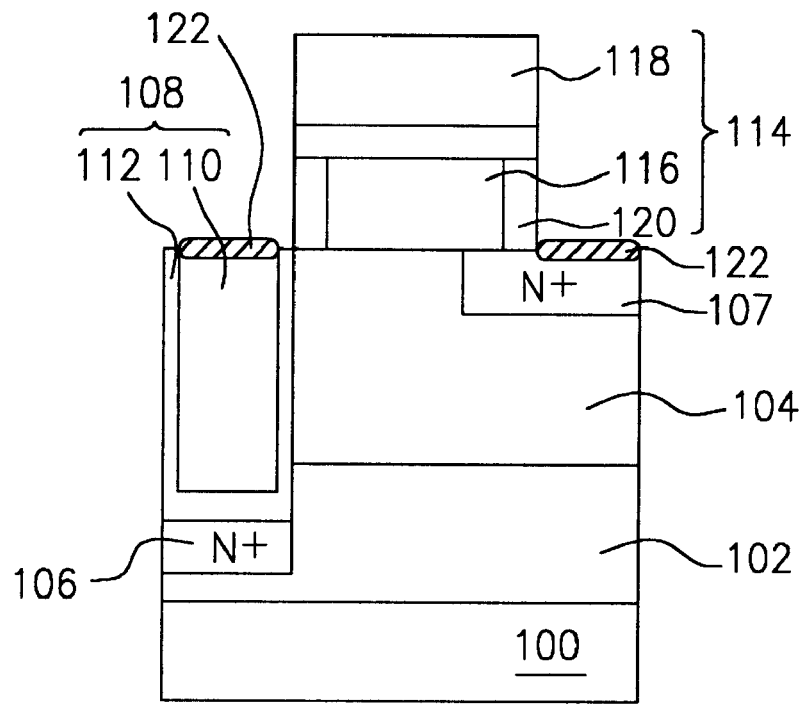
FIG. 2 is a schematic cross-sectional view of the main body structure of a trench split-gate non-volatile flash memory cell according to one preferred embodiment of this invention.

FIG. 2 is a schematic cross-sectional view of the main body structure of a trench split-gate non-volatile flash memory cell according to one preferred embodiment of this invention. As shown in FIG. 2, the flash memory cell includes a P-type substrate 100, a deep N-well layer 102 and a P-well layer 104 from bottom to top. A heavily doped (with $N^+$ ions) region inside the deep N-well layer forms a source region 106.

A trench auxiliary gate region 108 is above the source region 106 buried inside the N-well layer 102 and the shallow P-well layer 104. The trench auxiliary gate region 108 includes a polysilicon layer 110 and an oxide layer 112. The oxide layer 112 is beneath and on each side of the polysilicon layer 110. A gate 114 is above the P-well layer 104 on one side of the auxiliary gate region 108. The gate 114 comprises a first polysilicon layer 116 (to serve as a floating gate), a second polysilicon layer 118 and an isolation layer 120. The second polysilicon layer 118 is above the first polysilicon layer 116 and the isolation layer 120 is between the first and the second polysilicon layer and on the sidewalls of the first polysilicon layer 116. The isolation layer 120, for example, can be an oxide-nitride-oxide (ONO) layer, an oxide-nitride (ON) layer or a silicon nitride (N) layer. A heavily doped (with N+ ions) region forms a drain region 107. The drain region 107 is embedded within the shallow P-well layer 104 on one side of the gate 114. A metal silicide layer 122 may also be formed on the exposed surface of the drain region 107 and the polysilicon layer 110 to lower resistance between the auxiliary gate and the drain region 107, thereby increasing reading current and reducing RC delay.

In a conventional trench split-gate flash memory cell, the auxiliary gate region (select gate in FIG. 1) and the source region together occupy about 50% of a memory cell. In this invention, however, a self-aligned trench-forming technique is used to bury the auxiliary gate region inside the shallow P-well layer 104 and the deep N-well layer 102 so that the source terminal also uses of the deep N-well layer (the entire component is built on the shallow P-well layer). Consequently, the overall dimension of each memory cell is reduced and packaging density the memory cells is increased.

Figure 3A:
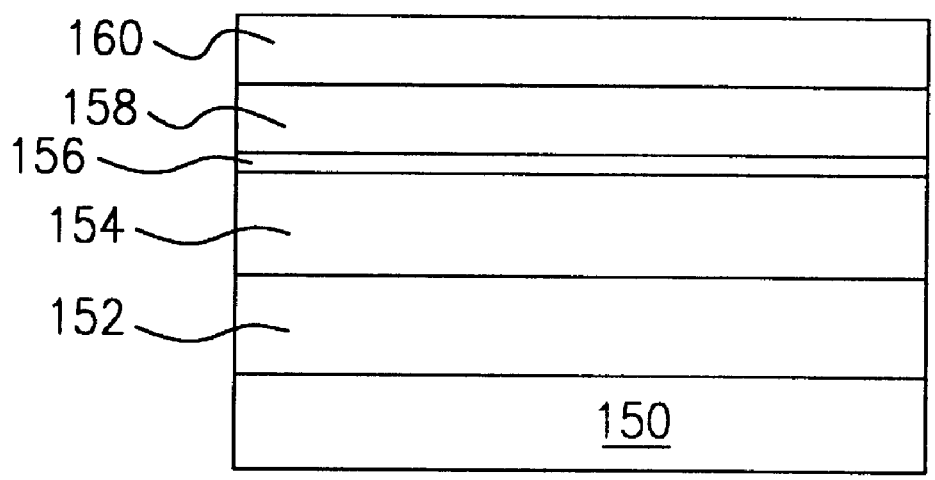
FIGS. 3A~3F are schematic cross-sectional views showing the progression of steps for producing a trench split-gate non-volatile flash memory cell according to this invention.

FIGS. 3A~3F are schematic cross-sectional views showing the progression of steps for producing a trench split-gate non-volatile flash memory cell of an AND array according to this invention. As shown in FIG. 3A, a P-type substrate 150 is provided. A deep N-well layer 152 and a shallow P-well layer 154 are sequentially formed over the P-type substrate 150. A channel oxide layer 156 is formed over the shallow P-well layer 154. A polysilicon layer 158 and a silicon nitride layer 160 are sequentially deposited over the channel oxide layer 156.

Figure 3B:
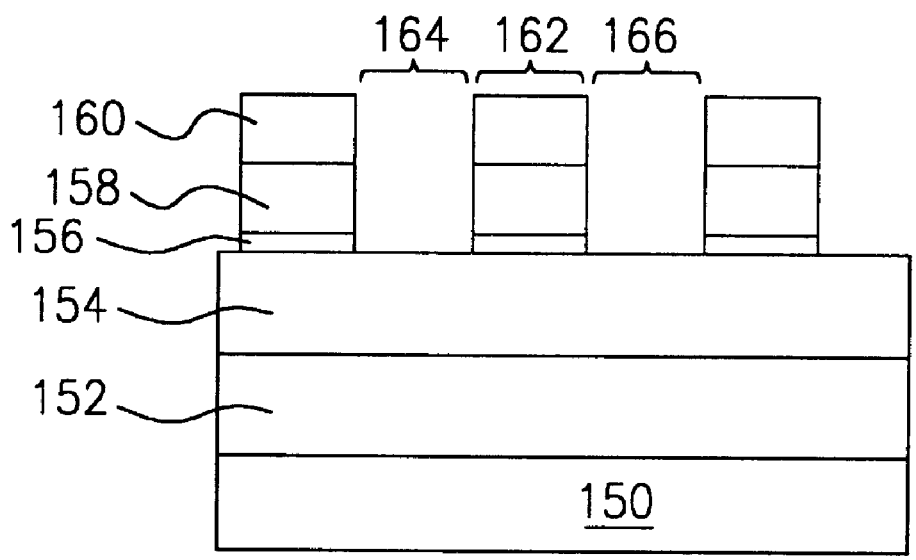
Figure 3C:
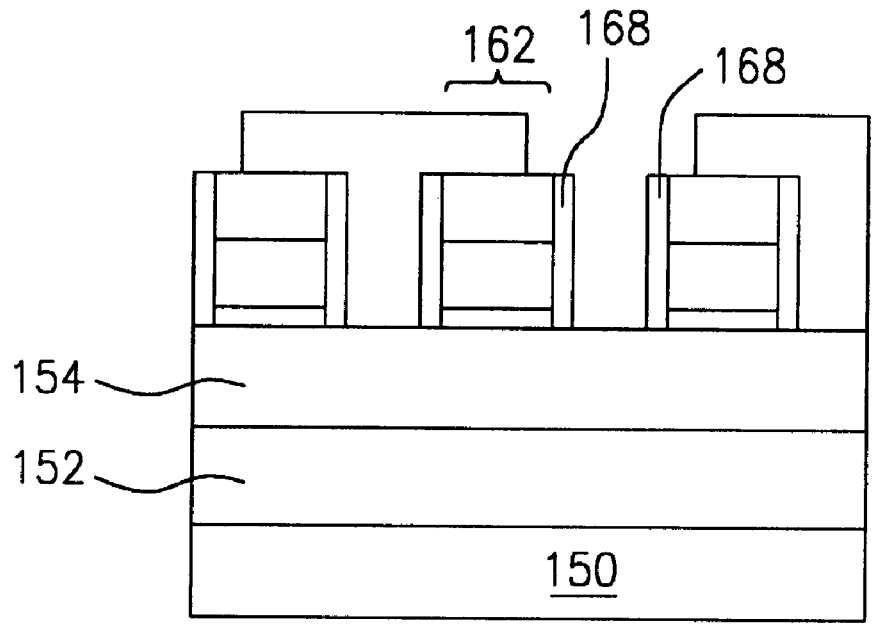
Figure 3D:
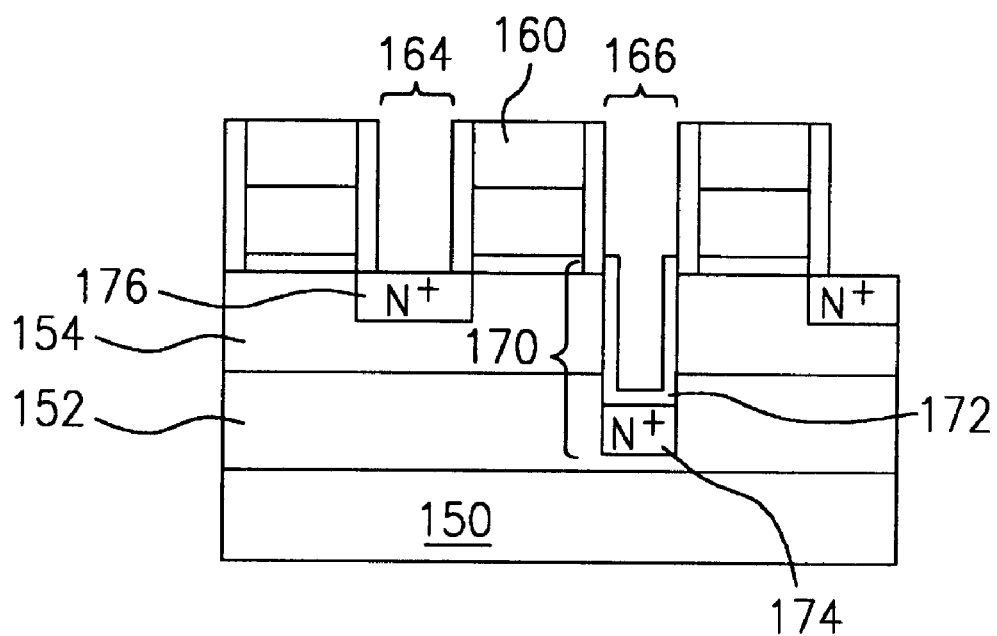

As shown in FIG. 3B, a portion of the polysilicon layer 158, the silicon nitride layer 160 and the channel oxide layer 154 are etched away to form a gate region 162 over the shallow P-well layer 154 and a drain region 164 and an auxiliary gate region 166 on each side of the gate region 162. As shown in FIG. 3C, a spacer 168 is formed on each side of the gate region 162. The spacer 168 protects the gate oxide layer during a trench-etching operation so that a higher production yield is obtained. As shown in FIG. 3D, a trench 170 is formed in the deep N-well layer 152 and the shallow P-well layer 154 within the auxiliary gate region 166. An oxide layer 172 is formed at the bottom and sides of the trench 170. A heavy ion implantation is carried out implanting dopant ions ($N^+$ ions) into the deep N-well layer 152 and the shallow P-well layer 154 within the drain region 164 underneath the trench 170, thereby forming a source terminal 174 and a drain terminal 176 respectively.

Figure 3E:
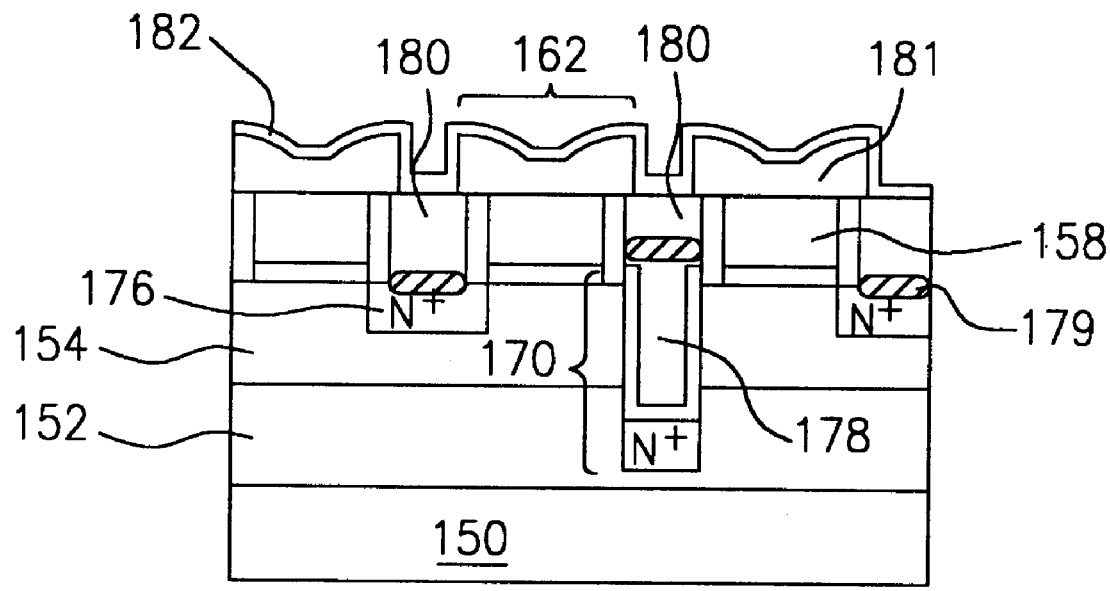
Figure 3F:
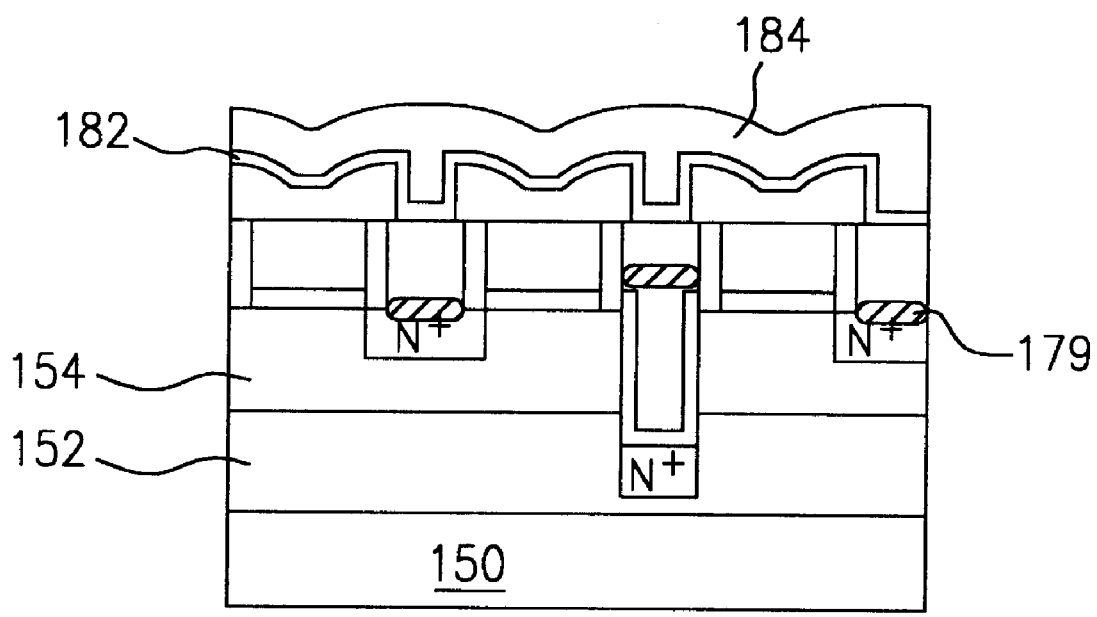

As shown in FIG. 3E, a polysilicon layer 178 is formed inside the trench 170 to form a trench auxiliary gate electrode. A metal silicide layer 179 is formed over the exposed surface of the drain region 176 and the polysilicon layer 178 to lower resistivity between the auxiliary gate 178 and the drain terminal 176, thereby increasing reading current and reducing RC delay. An isolation layer 180 is formed over the auxiliary gate 178 and the drain terminal 176. The silicon nitride layer 160 as shown in FIG. 3D is removed. A first polysilicon layer 181 is formed over the polysilicon layer 158 within the gate region 162, thereby forming a floating gate terminal. Another isolation layer 182 is formed over the first polysilicon layer 181, the drain terminal 176 and the trench 170 region. As shown in FIG. 3F, a second polysilicon layer 184 serving as a control gate is formed over the isolation layer 182. The aforementioned spacers 168 and isolation layer 182 can be ON layers or ONO layers, for example.

Figure 4A:
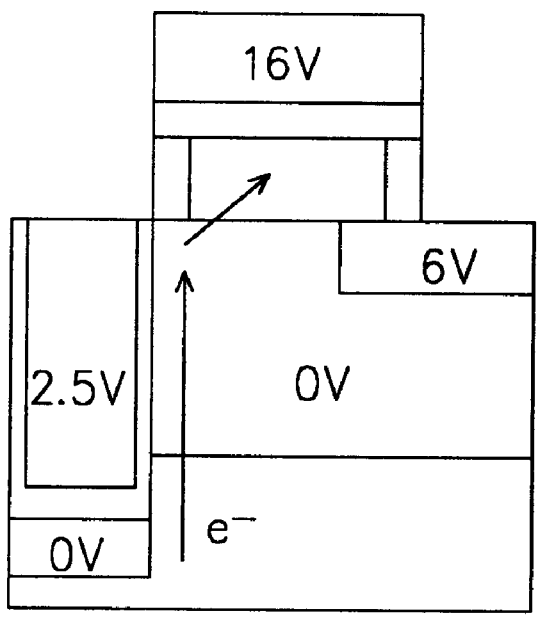
FIGS. 4A~4C are schematic cross-sectional diagrams showing the operations of programming data into, erasing data and reading data from a trench split-gate non-volatile flash memory cell according to this invention.
Figure 4B:
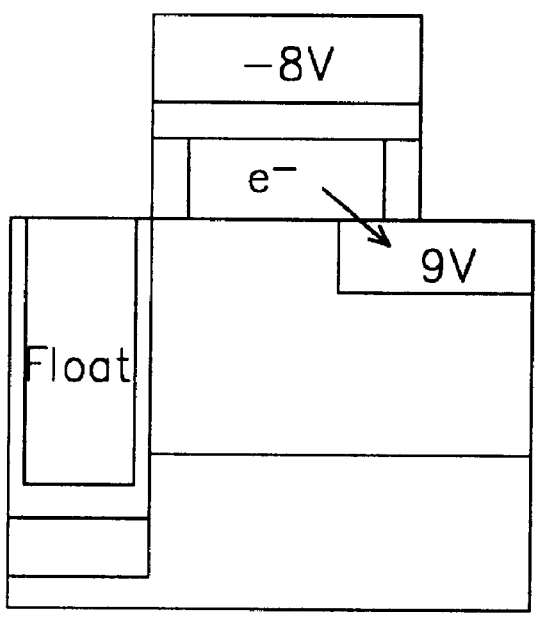
Figure 4C:
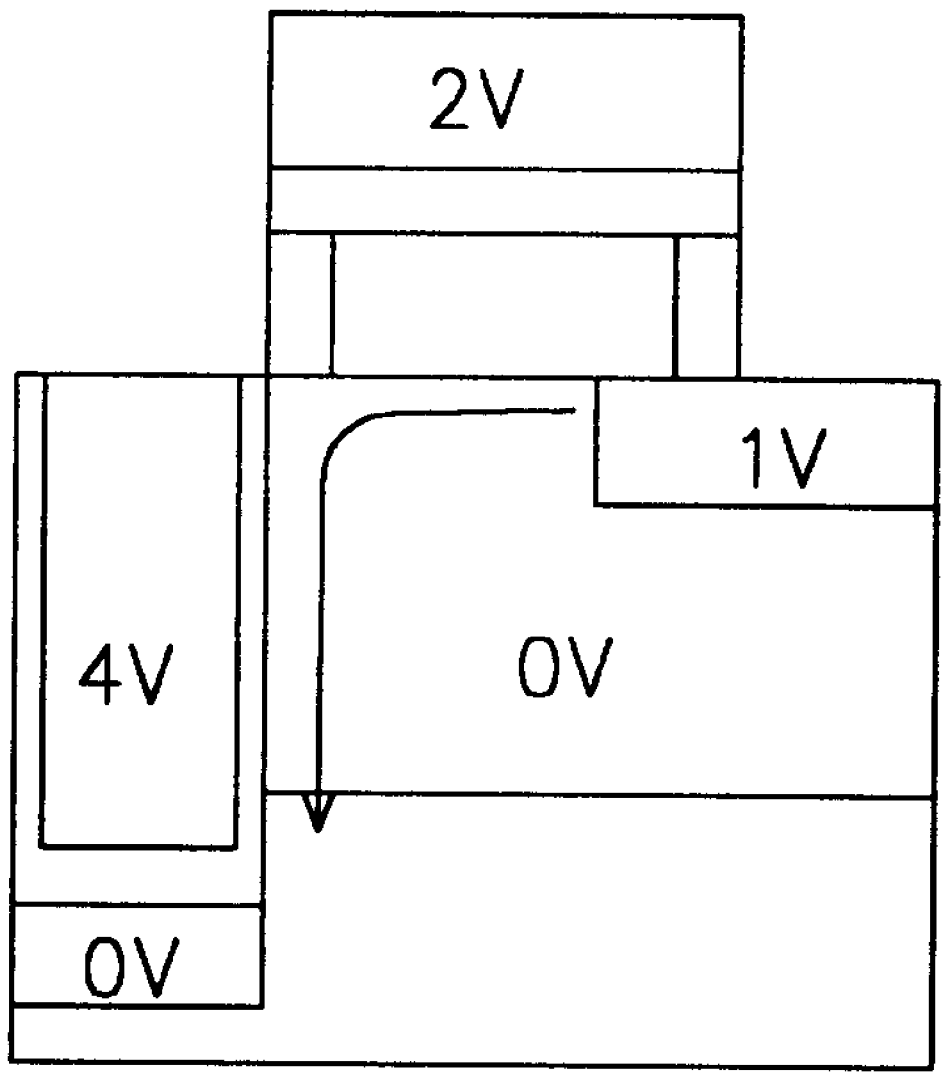

FIGS. 4A–4C are schematic cross-sectional diagrams showing the operations of programming data into, erasing data and reading data from a trench split-gate non-volatile flash memory cell according to this invention.

The configuration for programming data into a flash memory cell is shown in FIG. 4A. A high voltage between 8V~16V (16V in FIG. 4A) is applied to a word line that leads to the gate terminal. A voltage lower than the word line voltage, for example, between 4V~10V (6V in FIG. 4A), is applied to a bit line that leads to the drain terminal. A voltage lower than the word line voltage, for example, between 1V~5V (2.5V in FIG. 4A) is applied to the auxiliary gate terminal. A voltage lower than both the word line voltage and the bit line voltage such as 0V is applied to the source terminal. A voltage such as 0V is applied to the substrate. Notice that the direction of electron injection from the source terminal into the floating gate is identical to the path for electron acceleration. Hence, operating efficiency of the memory cell may increase up to $10^{-3}$ compared with $10^{-4}$~$10^{-6}$ of a conventional split-gate flash memory cell.

The configuration for erasing data from the flash memory cell is shown in FIG. 4B. A low voltage, for example, between 8V~−16V (−8V in FIG. 4B) is applied to the word line. A voltage higher than the word line voltage, for example, between 4V~10V (9V in FIG. 4B) is applied to the drain terminal. A voltage higher than the word line voltage, for example, around 0V (or a floating state voltage), is applied to the auxiliary gate terminal. A voltage higher than the word line voltage but lower than the bit line voltage, for example, around 0V (or a floating state voltage), is applied to the source terminal. A voltage of around 0V is also applied to the substrate.

The configuration for reading data from a flash memory cell is shown in FIG. 4C. A high voltage, for example, between 0V~6V (2V in FIG. 4C), is applied to the word line. A voltage lower than the word line voltage, for example, between 0V~5V (1V in FIG. 4C), is applied to the drain terminal. A voltage higher than the word line voltage, for example, between 0V~5V (4V in FIG. 4C), is applied to the auxiliary gate terminal. A voltage higher than the word line voltage but lower than the bit line voltage such as 0V is applied to the source terminal. Similarly, 0V is applied to the substrate.

Figure 5:
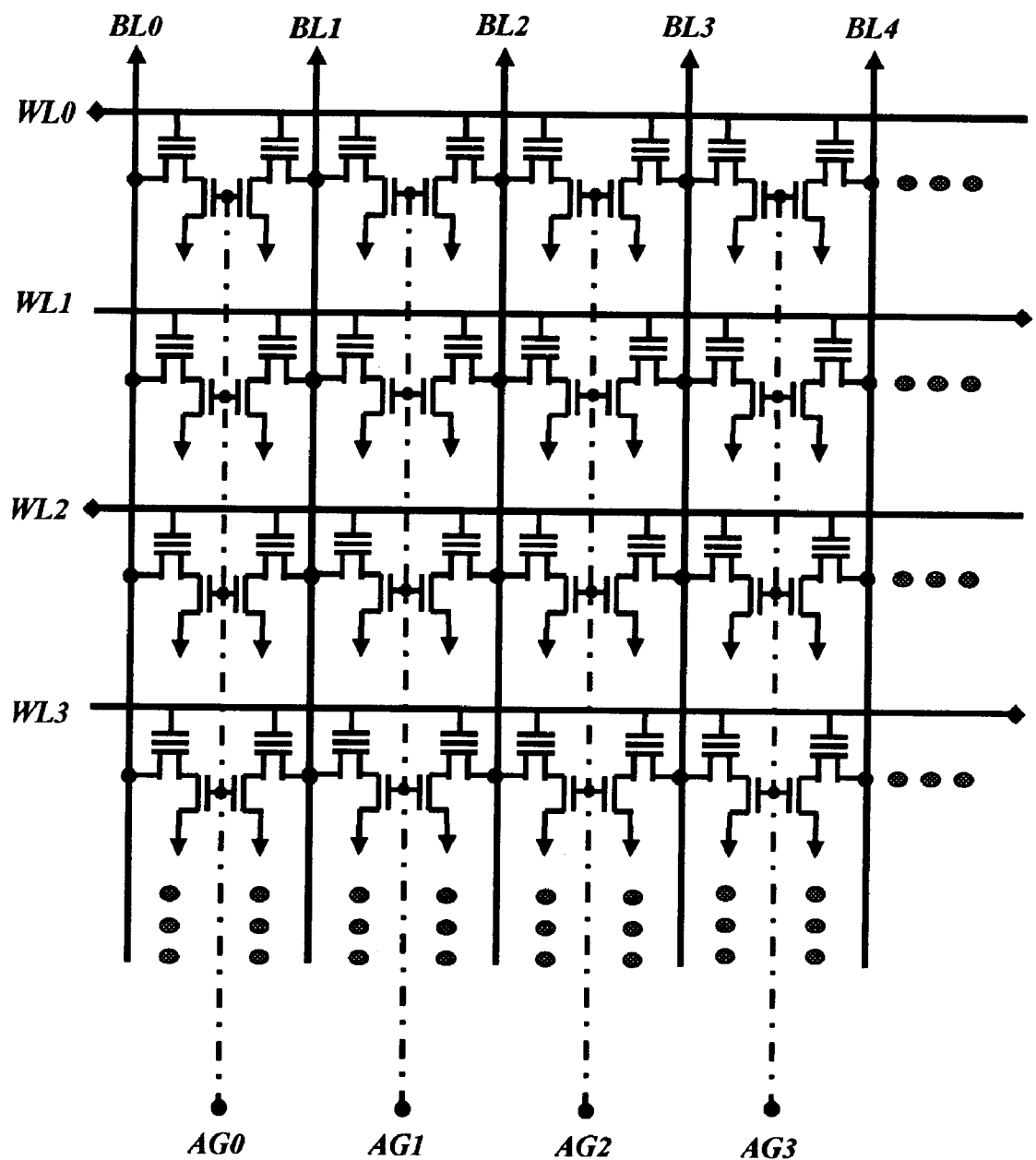
FIG. 5 is a circuit drawing, schematically illustrating an application of the flash memory on the AND-type array, according to this invention.

A few of actual applications of the invention are described as follows. FIG. 5 is a circuit drawing, schematically illustrating an application of the flash memory on the AND-type array, according to this invention. In FIG. 5, a ballistic injection mechanism is employed for encoding action, where it means that hot electrons are injected into the source terminal by a ballistic manner. This mechanism is therefore called as Ballistic injection AND-type flash EEPROM (BiAND). The BiAND array and the typical AND-type array have the same arrangement about the fixing terminal of source terminal and gate terminal, but the insulating oxide layer in the BiAND array is similar to manner of the virtually grounded AND-type array, in which the insulating oxide layer along the channel is removed. Therefore, the structure of the BiAND array is between the typical AND-type array and virtually grounded AND-type array. In this manner, the area of the insulating oxide layer can be saved so as to greatly reduce the occupation area of the flash memory cells. However, it then cannot increase the wing of the control gate and the floating gate due to the insulating oxide layer being saved. This means that the coupling coefficient between the floating gate and the control gate could be reduced. In order to increase the coupling coefficient, a special design on the floating gate is necessary for the whole BiAND device. That is why the floating gate is designed in 3D structure, so as to increase the coupling coefficient. This principle of the invention can also be applied to the designs of NOR, NAND, AND array.

Figure 6:
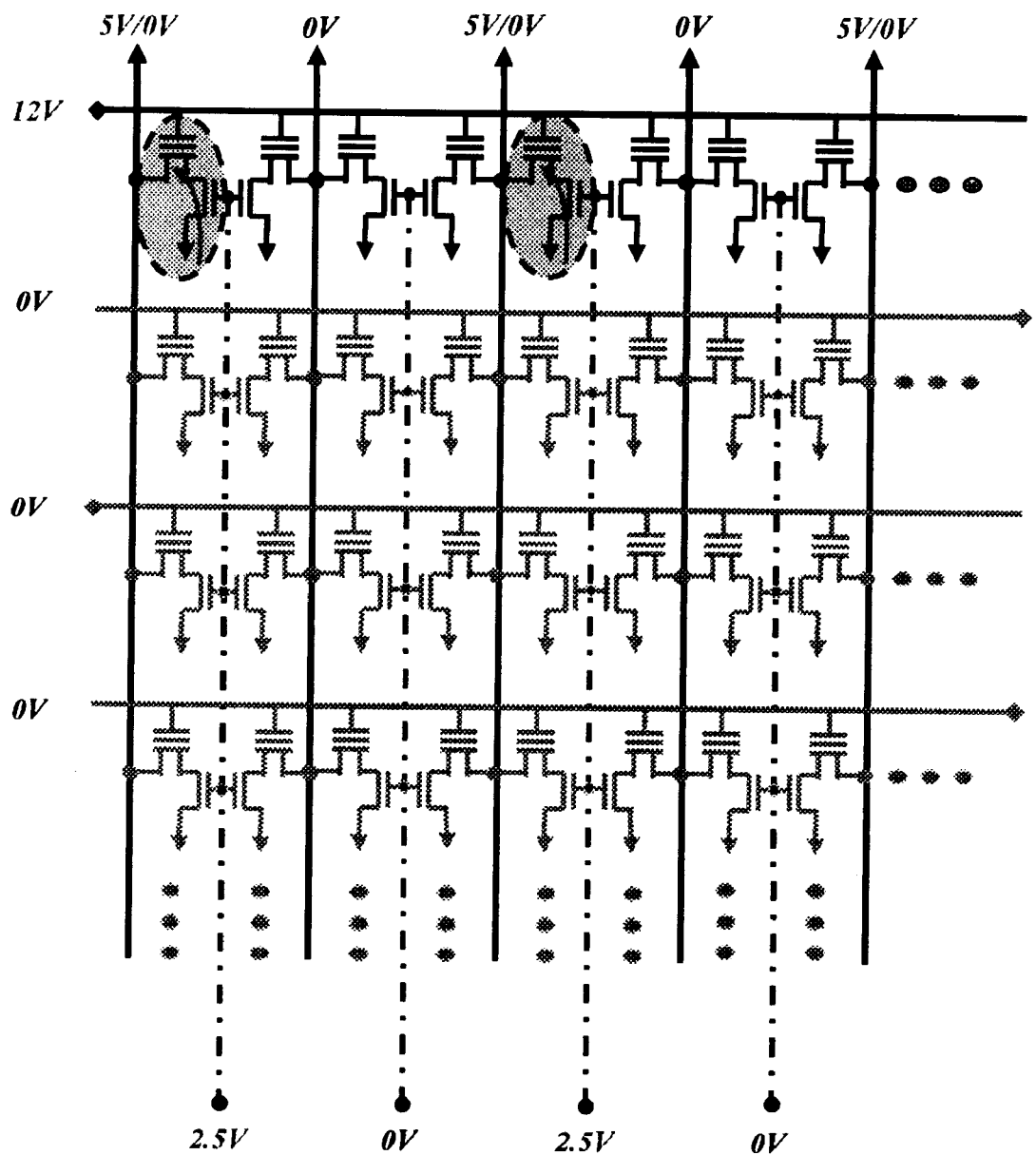
FIG. 6 is a circuit drawing, schematically illustrating an encoding action for multiple bits by once in a BiAND-type array is performed, according to this invention.

The encoding action for the BiAND-type is shown in FIG. 6. The corresponding working voltages for encoding are also listed in Table 1:

[t1]

TABLE 1

|  | Byte 1 Program | Byte 2 Program | Byte 3 Program | Byte 4 Program |
| --- | --- | --- | --- | --- |
| Word-Line 0 |  |  | 12 V |  |
| Word-Line Others |  |  | 0 V |  |
| Bit-Line Odd | 5 V/0 V | 0 V | 0 V | 5 V/0 V |
| Bit-Line Even | 0 V | 5 V/0 V | 5 V/0 V | 0 V |
| AG-Line Odd | 2.5 V | 2.5 V | 0 V | 0 V |
| AG-Line Even | 0 V | 0 V | 2.5 V | 2.5 V |
| Source-Line |  |  | 0 V |  |
| P-Sub |  |  | 0 V |  |

TABLE 1-continued

|  | Byte 1 Program | Byte 2 Program | Byte 3 Program | Byte 4 Program |
|---|---|---|---|---|
| Cell Location in 1st WL | 4(n − 1) + 1 | 4(n − 1) + 2 | 4(n − 1) + 3 | 4(n − 1) + 4 |

Note: n = 1~8

If one wants to encode a word for the BiAND-type array, that is, an 8-bit encoding action is intended. In this case, the word line is applied with a voltage of 12V. Then, the devices at the $1^{st}, 5^{th}, 9^{th}, 13^{th}, \ldots 4(n-1)+1$, where n is 8 in the case, are selected, and all of the drains are connected and applied by a voltage of 5V. The auxiliary word line is applied by 2.5V. The other devices without connection remain 0V. In this manner, the 8-bits can be encoded. Likewise, for the second word is stored on the devices at 2, 6, 10, 14, . . . 4(n−1)+2. The third word is stored at 3, 7, 11, 15, . . . 4(n−1)+3. Multiple bits can be simultaneously operated in the BiAND arrary.

Figure 7:
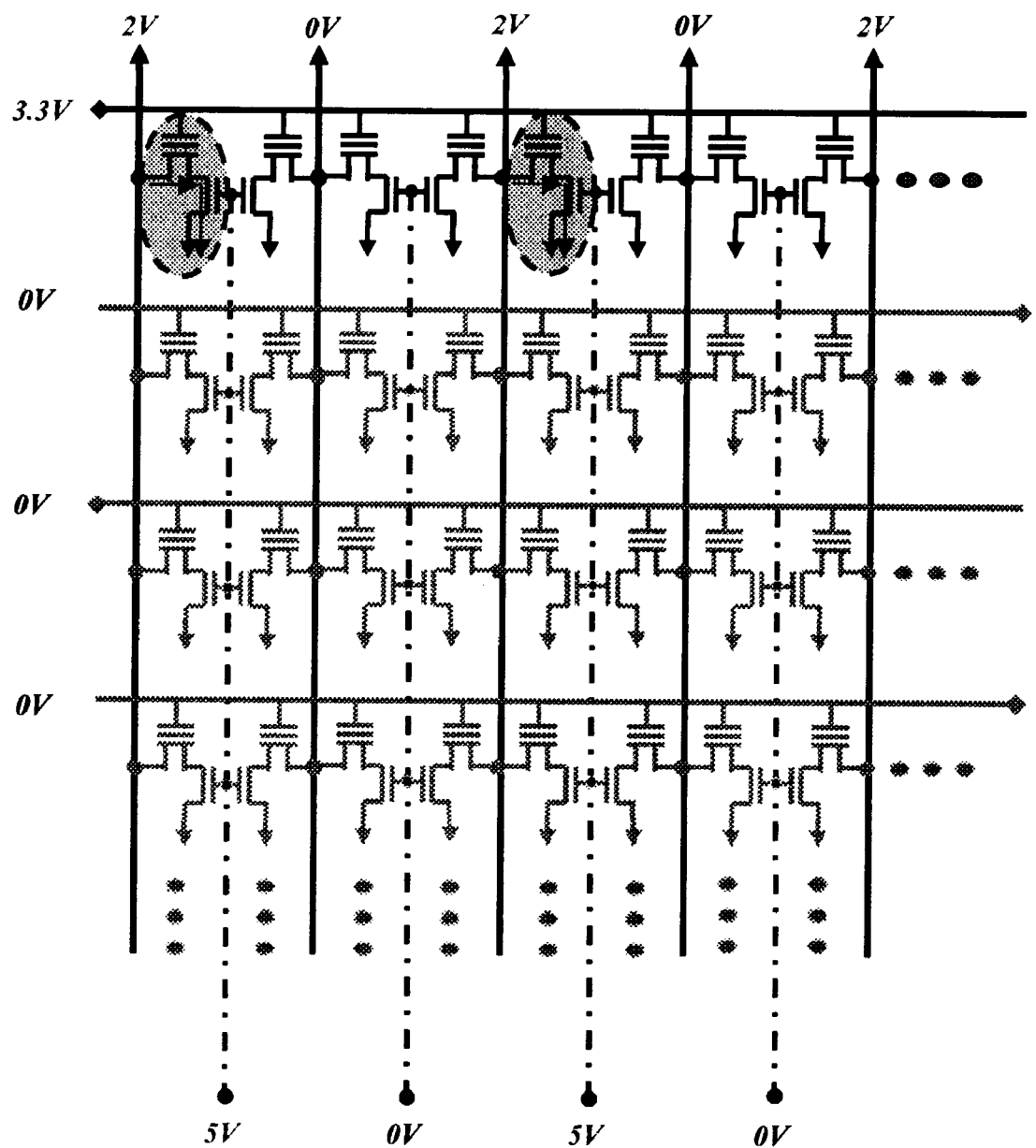
FIG. 7 is a circuit drawing, schematically illustrating another encoding action for multiple bits by once in a BiAND-type array is performed, according to this invention.

FIG. 7 describes how to read multiple bits by once action. The corresponding working voltages for encoding are also listed in Table 2:
[t2]

TABLE 2

|  | Byte 1 Read | Byte 2 Read | Byte 3 Read | Byte 4 Read |
|---|---|---|---|---|
| Word-Line 0 |  |  | 3.3 V |  |
| Word-Line Others |  |  | 0 V |  |
| Bite-Line Odd | 2 V | 0 V | 0 V | 2 V |
| Bit-Line Even | 0 V | 2 V | 2 V | 0 V |
| AG-Line Odd | 5 V | 5 V | 0 V | 0 V |
| AG-Line Even | 0 V | 0 V | 5 V | 5 V |
| Source-Line |  |  | 0 V |  |
| P-Sub |  |  | 0 V |  |
| Cell Location in 1st WL | 4(n − 1) + 1 | 4(n − 1) + 2 | 4(n − 1) + 3 | 4(n − 1) + 4 |

Note: n = 1~8

When the channel hot electrons are used to encode the device in the flash memory device, the voltages applied for reading action is just reducing the voltage level from that of encoding action. It is sufficient for the voltage to read the current and without injecting the hot electrons into the floating gate, i.e., the device is not set to work at the saturation condition. If a reading action for a word on the BIAND array is to intended, that is, 8 bits are to be read simultaneously. The selected word lines of 1, 5, 9, 13, . . . 4(n−1)+1 are applied by 4V, where n is equal to 8 in the case. The connected bit line is applied by 2V. The auxiliary bit line is set to 5V. The other devices without connection are set to 0V. Likewise, the other words can be Read by the same manner.

If the BiAND array is to be erased, all of the word lines are applied by −10V. the drains terminals are applied by 4V, and the auxiliary gate, source terminal, and substrate are applied by 0V, so as to have the tunneling effect between the drain terminal and the floating gate. The electrons are drawn out from the floating gate, so as to reduce the threshold voltage and the erasing action is accomplished.

In summary, one major aspect of this invention is the construction of a source terminal and an auxiliary gate inside a shallow P-well layer and a deep N-well layer so that area occupation of these regions is greatly reduced. Moreover, the hot electrons that inject into the floating gate during programming follow a path identical to the path of acceleration for the electrons. Therefore, the operating efficiency of the memory cell structure is increased and resistivity at the source terminal is reduced when data is read from the cell. In addition, a metal silicide layer may form over the drain terminal and the auxiliary gate to reduce the resistance between the auxiliary gate and the drain terminal. Hence, reading current is increased and RC delay is reduced. Ultimately, average operating speed of the flash memory structure increases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a trench split-gate non-volatile flash memory cell structure, comprising the steps of:

forming a P-type substrate;

forming a deep N-well layer over the P-type substrate;

forming a shallow P-well layer over the deep N-well layer;

forming a gate region above the shallow P-well layer and marking out a drain region and an auxiliary gate region on each side of the gate region;

forming a spacer on each side of the gate region;

forming a trench in the deep N-well layer and the shallow P-well layer within the auxiliary gate region;

forming an oxide layer inside the trench;

performing a heavy dopant implantation to implant ions into the deep N-well layer and the drain region of the shallow P-well layer underneath the trench, thereby forming a source terminal and a drain terminal;

depositing polysilicon material to fill the trench, thereby forming a trench auxiliary gate;

forming a first polysilicon layer over the gate region, thereby forming a floating gate;

forming an isolation layer over the first polysilicon layer, the drain region and the filled trench region; and forming a second polysilicon layer over the isolation layer, thereby forming a control gate.

2. The method of claim 1, wherein material forming the spacers and the isolation layer includes an oxide-nitride of silicon.

3. The method of claim 1, wherein material forming the spacers and the isolation layer includes an oxide-nitride-oxide of silicon.

4. The method of claim 1, wherein material forming the spacers and the isolation layer includes silicon nitride.

5. The method of claim 1, wherein after the step of depositing polysilicon material into the trench, further includes forming a silicon nitride layer over the exposed surface of the drain region and the polysilicon layer.

* * * * *